US007415150B2

(12) United States Patent
Maali

(10) Patent No.: US 7,415,150 B2
(45) Date of Patent: Aug. 19, 2008

(54) PHOTOMASK IMAGE REGISTRATION IN SCANNING ELECTRON MICROSCOPE IMAGERY

(75) Inventor: Fereydoun Maali, Toms River, NJ (US)

(73) Assignee: Synopsys, Inc., Mountain View, CA (US)

(*) Notice: Subject to any disclaimer, the term of this patent is extended or adjusted under 35 U.S.C. 154(b) by 848 days.

(21) Appl. No.: 10/974,055

(22) Filed: Oct. 26, 2004

(65) Prior Publication Data

US 2005/0286755 A1    Dec. 29, 2005

Related U.S. Application Data

(60) Provisional application No. 60/582,788, filed on Jun. 25, 2004.

(51) Int. Cl.
*G06K 9/00*    (2006.01)
(52) U.S. Cl. ................. 382/151; 382/224; 382/283; 382/287
(58) Field of Classification Search ............. 382/151, 382/224, 283, 287
See application file for complete search history.

(56) References Cited

U.S. PATENT DOCUMENTS 7,260,813 B2 *    8/2007    Du et al. .................. 716/21

OTHER PUBLICATIONS

Publication: "Generalizing the Hough Transform to Detect Arbitrary Shapes", by D.H. Ballard, Pattern Recognition, vol. 13, No. 2, pp. 111-122, 1981, printed in Great Britain.
Publication: "A Parallel Mechanism for Detecting Curves in Pictures", by Philip M. Merlin and David J. Farber, IEEE Transactions on Computers, Jan. 1975, pp. 96 to 98.
Publication: Machine Vision Applications, Architectures, and Systems Integration III, by Batchelor et al., Proceedings, SPIE—The International Society for Optical Engineering, vol. 2347, Oct. 31-Nov. 2, 1994, Boston, Massachusetts.
Publication: "A Survey of Image Registration Techniques", by Lisa Gottesfeld Brown, Department of Computer Science, Columbia University, New York, NY 10027, ACM Computing Surveys, vol. 24, No. 4, Dec. 1992.
Publication: "Vector Morphology and Iconic Neural Networks", by Stephen S. Wilson, IEEE Transactions on Systems, Man and Cybernetics, vol. 19, No. 6, Nov./Dec. 1989, pp. 1636 to 1644.

* cited by examiner

*Primary Examiner*—Matthew C. Bella
*Assistant Examiner*—Mike Rahmjoo
(74) *Attorney, Agent, or Firm*—Park, Vaughan & Fleming LLP

(57) ABSTRACT

One embodiment of the present invention provides a system that computes translational differentials between a "perfect" image (henceforth called a database-image) and a scanned-image of a photomask. During operation, the system receives a noise-free database-image and a scanned-image that is generated by an imaging process. Next, the system computes a set of candidate-translational-differentials using the database-image and the scanned-image. The system then generates one or more sets of translated directional-gradient-images based on the set of candidate-translational-differentials and using the database-image and the scanned-image. Next, the system converts the database-image into a set of smoothed directional-gradient-images. Finally, the system computes translational differentials by performing a normalized correlation using the set of smoothed directional-gradient-images and the one or more sets of translated directional-gradient-images. Note that the computational time is significantly reduced because the method performs normalized correlation using only the set of candidate-translational-differentials, instead of exhaustively performing normalized correlation using all possible translational differentials.

36 Claims, 6 Drawing Sheets

PHOTOMASK IMAGE REGISTRATION IN SCANNING ELECTRON MICROSCOPE IMAGERY

RELATED APPLICATION

This application hereby claims priority under 35 U.S.C. §119 to U.S. Provisional Patent Application No. 60/582,788, filed on 25 Jun. 2004, entitled "Photomask Image Registration in Scanning Electron Microscope Imagery," by inventor Fereydoun Maali.

BACKGROUND

1. Field of the Invention

This invention relates to the process of fabricating semiconductor chips. More specifically, the invention relates to a method and apparatus for registering a database image against a noisy scanned image, such as an image taken using a Scanning Electron Microscope.

2. Related Art

The relentless miniaturization of integrated circuits has been a key driving force behind recent advances in computer technology. Today, integrated circuits are being built at deep sub-micron (DSM) dimensions. At these dimensions, photomask accuracy is becoming increasingly important in the chip manufacturing process.

A photomask is typically a high-purity quartz or glass plate that contains deposits of chrome metal, which represents the features of an integrated circuit. The photomask is used as a "master" by chipmakers to optically transfer these features onto semiconductor wafers.

The mask-making process involves complex physical, transport, and chemical interactions. As a result, the actual photomask is different from the "perfect" photomask. If this difference is too large, it can render the photomask useless. Hence, it is important to measure the features of the actual photomask, so that one can ensure that the difference is within the error tolerance.

Before the features on the actual photomask can be measured, the photomask needs to be scanned using an imaging process to generate a scanned image. Furthermore, the scanned image must be accurately aligned with the perfect image so that the features on the scanned image can be accurately measured. This alignment process is called "photomask image registration".

Typically, photomask image registration only involves determining the translational differentials (in 2D space) between the scanned image and the perfect image.

Unfortunately, the scanned image can contain noise, which can sometimes be excessive, e.g., the noise in a Scanning Electron Microscope (SEM) image. Furthermore, the scanned image and the perfect image can have different pixel depths. Moreover, the scanned image can contain a large number of pixels. For example, the scanned image can be a 512×512 grayscale image with an 8-bit pixel depth. For these reasons, it is very difficult to accurately and efficiently compute the translational differentials between the scanned image and the perfect image of a photomask, especially when the scanned image has low signal-to-noise ratio (as in SEM images).

Consequently, image registration for noisy images (e.g., SEM images) is typically performed manually. Unfortunately, this manual step slows down the chip fabrication process, which increases the cost and the time taken to manufacture chips.

Hence, what is needed is a method and apparatus for accurately and efficiently computing the translational differentials between the scanned image and the perfect image of a photomask.

SUMMARY

One embodiment of the present invention provides a system for registering a noisy scanned image, such as a Scanning Electron Microscope (SEM) image, against its "perfect" image (henceforth called a database-image) counterpart. Specifically, the system determines the translational differentials between an image pair that share some degree of overlap. Note that the database image is a mere blueprint represented as a noise free binary image depicting synthesized integrated circuit (IC) features. On the other hand, the scanned image is the result of an imaging process, which invariably suffers from some degree of noise. Note that the database and scanned image images are not of the same modality.

In a variation on this embodiment, the system computes translational differentials between a database-image and a scanned-image of a photomask. Specifically, one embodiment of the present invention computes the translational differentials by exploiting the linear nature of the integrated circuit (IC) feature boundaries. During operation, the system receives a noise-free database-image and a scanned-image that is generated by an imaging process. Next, the system computes a set of candidate-translational-differentials using the database-image and the scanned-image. The system then generates one or more sets of translated directional-gradient-images based on the set of candidate-translational-differentials and using the database-image and the scanned-image. Next, the system converts the database-image into a set of smoothed directional-gradient-images. Finally, the system computes translational differentials by performing a normalized correlation using the set of smoothed directional-gradient-images and the one or more sets of translated directional-gradient-images. Note that the computational time is significantly reduced because the method performs normalized correlation using only the set of candidate-translational-differentials, instead of exhaustively performing normalized correlation using all possible translational differentials.

In a variation on this embodiment, the system converts the database-image and the scanned-image into a database-gradient-image and a scanned-gradient-image, respectively. Next, the system computes database-projection-vectors from the database-gradient-image and scanned-projection-vectors from the scanned-gradient-image by taking orthogonal projections along a set of directions. The system then extracts correlation-vectors from the database-projection-vectors. Next, the system maps the scanned-projection-vectors to obtain accumulator-vectors in an accumulator space by using the correlation-vectors. Finally, the system computes a set of candidate-translational-differentials based on the peak-cluster locations in the accumulator space, wherein a peak-cluster is a collection of contiguous elements around a peak (including the peak).

In a variation on this embodiment, the system creates a directional-gradient filter using the database-image, wherein the directional-gradient filter can be used to attenuate edgels that do not conform to the directional gradients of feature edges in the database-image. Next, the system converts the database-image and the scanned-image into a set of database directional-gradient-images and a set of scanned directional-gradient-images, respectively. The system then generates a raw database-gradient-image and a raw scanned-gradient-image from the set of database directional-gradient-images and the set of scanned directional-gradient-images, respectively. Finally, the system applies the directional-gradient filter to the raw database-gradient-image and the raw scanned-gradient-image to obtain the database-gradient-image and the scanned-gradient-image, respectively.

In a variation on this embodiment, the system de-projects only the cluster-peaks in the accumulator-vectors to obtain reconstructed scanned-projection-vectors. Next, the system de-projects the reconstructed scanned-projection-vectors to obtain reconstructed directional-gradient-images. Finally, the system generates one or more sets of translated directional-gradient-images by displacing the reconstructed directional-gradient-images using the set of candidate-translational-differentials. Note that by de-projecting only the cluster-peaks, the system improves the signal-to-noise ratio of the reconstructed directional-gradient-images.

In a variation on this embodiment, the system convolves the database-image with a horizontal and a vertical Point Spread Function (PSF) to generate a horizontal edgel-image and a vertical edgel-image, respectively. Next, the system computes a gradient-magnitude-image using the horizontal edgel-image and the vertical edgel-image. The system then applies a clip-low filter to the gradient-magnitude-image to obtain a clipped-gradient-image. Next, the system generates a histogram using the gradient orientations in the clipped-gradient-image. Finally, the system creates the directional-gradient filter using the histogram.

In a variation on this embodiment, the system converts the database-gradient-image into a set of unsmoothed directional-gradient-images. The system then applies a low-pass filter to the set of unsmoothed directional-gradient-images to obtain the set of smoothed directional-gradient-images.

In a variation on this embodiment, the system computes the translational differentials by selecting the set of translated directional-gradient-images that has the maximum aggregate-normalized-correlation with the set of smoothed directional-gradient-images.

In a variation on this embodiment, the system registers the scanned image against its database image, i.e., determines the translational differentials that maximize the similarity between a scanned image and its binary blueprint, wherein the similarity is measured as a normalized correlation coefficient.

In a variation on this embodiment, the system qualifies the image registration result using a figure of merit that provides a measure of confidence in the quality of the result.

In a variation on this embodiment, the photomask contains only rectilinear features. In another variation on this embodiment, the photomask contains a combination of rectilinear and non-rectilinear features. In yet another variation on this embodiment, the photomask contains only non-rectilinear features.

In a variation on this embodiment, the system computes the database-projection-vectors from the database-gradient-image and the scanned-projection-vectors from the scanned-gradient-image by taking an orthogonal projection along the horizontal direction and the vertical direction.

In a variation on this embodiment, if the database-image and the scanned-image have slightly different dimensions, the system computes the set of candidate-translational-differentials by using a smoothing filter to integrate double peaks in the accumulator space into a single peak.

In a variation on this embodiment, the system registers image pairs in which the scanned image and the database image have different sizes.

In a variation on this embodiment, the system can tolerate ambiguous contrast polarity. Specifically, the system does not rely on contrast direction between the scanned image regions and regional correspondence between the image pair based on contrast polarity.

In a variation on this embodiment, the system can tolerate moderate sizing problems. Note that sizing problem arise from dimension discrepancies between the synthesized IC features depicted in the database image and their actual dimension as imaged by imaging devices such an electron microscope.

In a variation on this embodiment, the system registers a database image against its scanned image when the latter is too noisy to tolerate correlation at coarser resolutions.

In a variation on this embodiment, the system computes the translational differentials between the database image and a noisy scanned image in an efficient manner when recourse to low resolution images would not work.

DETAILED DESCRIPTION

Integrated Circuit Design and Fabrication

Figure 1:
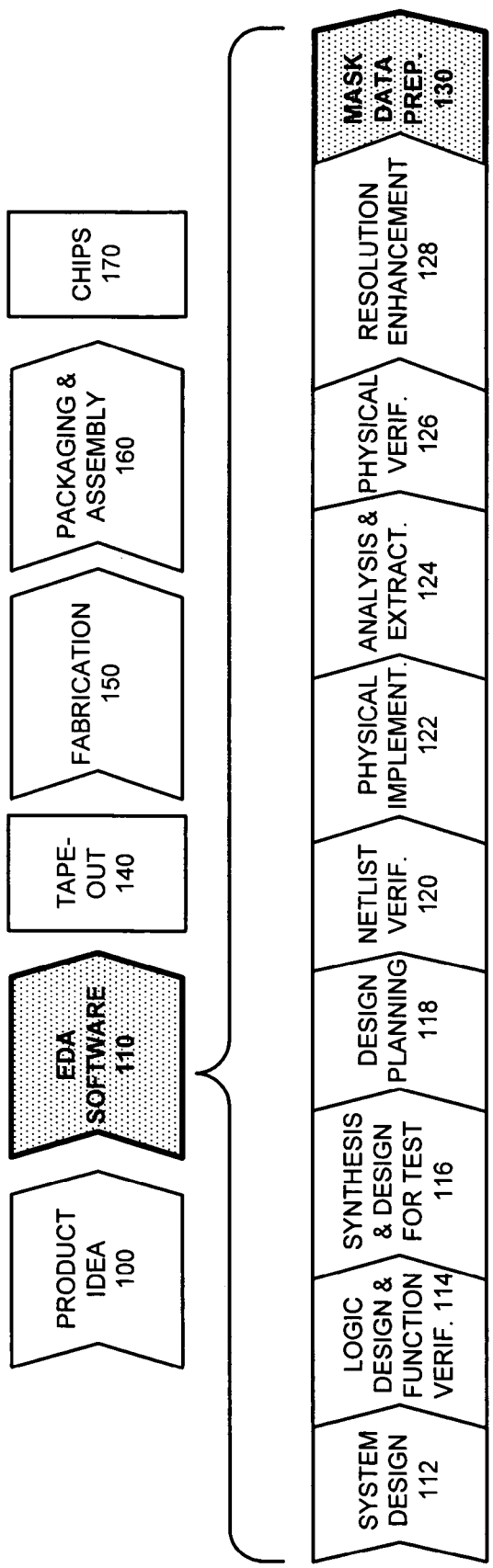
FIG. 1 illustrates the various steps in the design and fabrication of an integrated circuit in accordance with an embodiment of the present invention.

FIG. 1 illustrates the various steps in the design and fabrication of an integrated circuit in accordance with an embodiment of the present invention. The process starts with a product idea (step 100). Next, the product idea is realized by an integrated circuit, which is designed using Electronic Design Automation (EDA) software (step 110). Once the design is finalized in software, it is taped-out (step 140). After tape-out, the process goes through fabrication (step 150), packaging, and assembly (step 160). The process eventually culminates with the production of chips (step 170).

The EDA software design step 110, in turn, includes a number of sub-steps, namely, system design (step 112), logic design and function verification (step 114), synthesis and design for test (step 116), design planning (step 118), netlist verification (step 120), physical implementation (step 122), analysis and extraction (step 124), physical verification (step 126), resolution enhancement (step 128), and mask data preparation (step 130).

Photomask image registration can take place within the mask data preparation step 130, which involves generating the "tape-out" data for production of masks that are used to produce finished chips. Note that the CATS™ family of products from Synopsys, Inc. can be used in the mask data preparation step 130.

Photomask Image Registration

Figure 2:
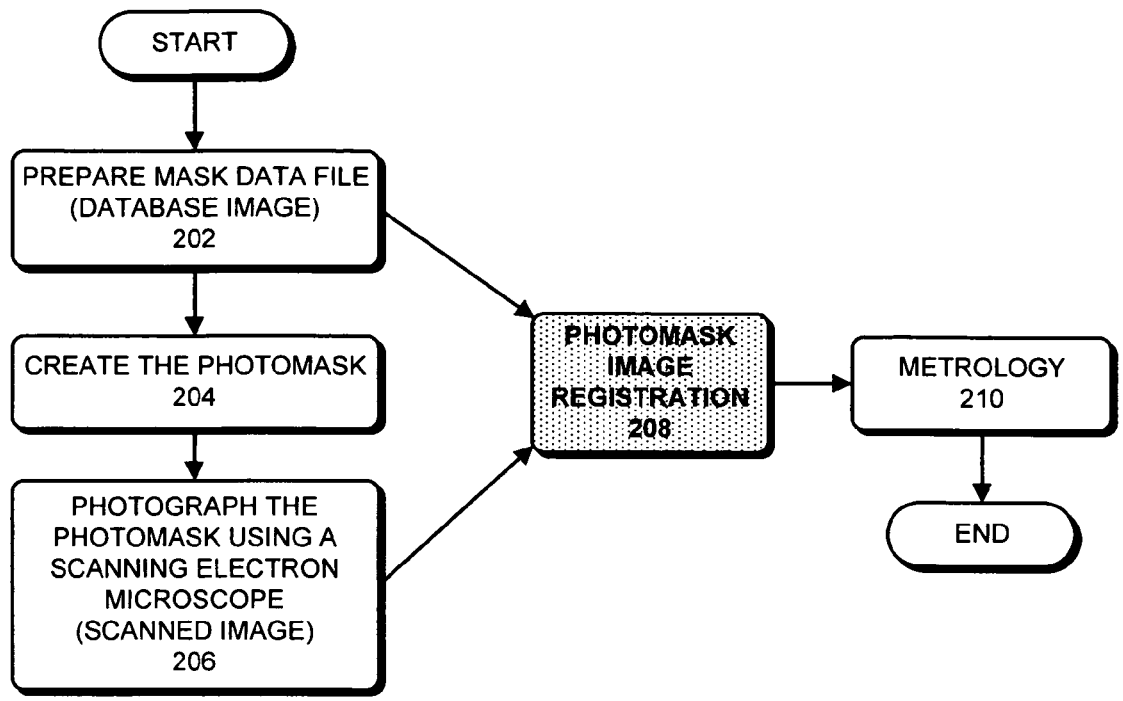
FIG. 2 illustrates a high level view of the photomask image registration process that precedes metrology in accordance with an embodiment of the present invention.

FIG. 2 illustrates a high level view of the photomask image registration process that precedes metrology in accordance with an embodiment of the present invention.

Once the logical design of an integrated circuit is finalized, the EDA software prepares a photomask data file (step 202), which describes the features on the photomask. Note that the photomask data file stores a digital representation of the "perfect" photomask image. Furthermore, note that the photomask data file is typically stored in a database. Accordingly, in the instant application, the term "database image" refers to this "perfect" photomask image.

Next, a mask-making machine creates the photomask (step 204) using the photomask data file. Specifically, when the circuit design is "taped out," it is translated into GDSII format that is then given to the mask data preparation software. The mask data preparation software converts or "fractures" the GDSII design data into a format that describes the pattern to the mask-making machine.

A photomask is typically a high-purity quartz or glass plate that contains deposits of chrome metal, which represents the features of an integrated circuit. The photomask is used as a "master" by chipmakers to optically transfer these features onto semiconductor wafers.

Specifically, the mask-making machine uses a laser or an electronic-beam to write the features of the integrated circuit onto a layer of photosensitive resist that has been added over a chrome layer on top of a blank mask. After exposure, the resist is developed, which clears away and uncovers the underlying chrome only where the circuit pattern is desired. The bared chrome is then etched. After etching, the remaining resist is completely stripped away, leaving the circuit image as transparent patterns in the otherwise opaque chrome film.

Note that the mask-making process involves complex physical, transport, and chemical interactions. As a result, the actual photomask image is different from the database image. If this difference is too large, it can render the photomask useless. Hence, it is critically important to measure the features of the actual photomask image, so that we can ensure that the difference is within the error tolerance. This measurement process is called metrology (step 210).

Before metrology (step 210) can take place, the photomask needs to be scanned (or photographed) using an imaging device, such as a scanning electron microscope (step 206). Henceforth, in the instant application, the term "scanned image" refers to a picture of the photomask that is taken using the imaging device. Furthermore, note that the scanned image (from step 206) must be aligned with the database image (from step 202) so that the features on the scanned image can be accurately measured. This alignment process is called "photomask image registration" (step 208).

In general, image registration involves spatially aligning two similar images. Specifically, in the absence of non-linearity, an image registration process results in a transformation matrix, which when applied to one of the images, aligns it with the other image. Note that, in general, image registration involves resizing, rotating, and translating an image. But, typically, photomask image registration only involves determining the translational differentials (in 2D space) between the database image and the scanned image.

Photomask Image Registration System

Figure 3:
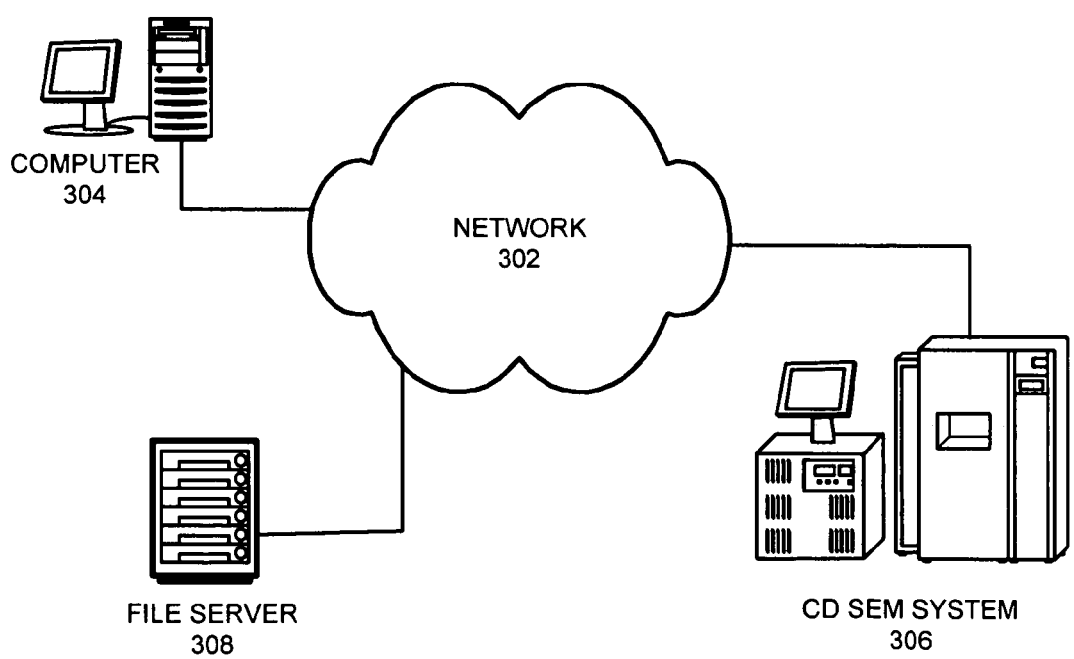
FIG. 3 illustrates a photomask image registration system that comprises a network which is coupled with a computer, a critical-dimension scanning-electron-microscope (CD SEM) system, and a file server in accordance with an embodiment of the present invention.

FIG. 3 illustrates a photomask image registration system that comprises a network 302 which is coupled with a computer 304, a critical-dimension scanning-electron-microscope (CD SEM) system 306, and a file server 308 in accordance with an embodiment of the present invention.

Note that the network 302 can generally include any type of wire or wireless communication channel capable of coupling together network nodes. This includes, but is not limited to, a local area network, a wide area network, or a combination of networks. In one embodiment of the present invention, network 302 includes the Internet.

Furthermore, in one embodiment of the present invention, the computer 304 stores and executes the image registration software. Moreover, in one embodiment of the present invention, the image registration software is included in the EDA software. Note that computer 304 can generally include any type of device that can perform computations. This includes, but is not limited to, a computer system based on a microprocessor, a personal computer, a mainframe computer, a server, and a workstation.

It will be apparent to one skilled in the art that the image registration software can be stored and executed in a number of ways. For example, in one embodiment of the present invention, the image registration software is executed on the CD SEM system 306.

In one embodiment of the present invention, the CD SEM system 306 can be used for taking detailed pictures of a photomask. Specifically, the resolution of the CD SEM system 306 can be less than the minimum feature size of the photomask. For example, in one embodiment of the present invention, the resolution of the CD SEM system 306 is a few nanometers, while the minimum feature size of the photomask is a few tenths of a micron.

Moreover, the CD SEM system 306 can be positioned with a high degree of precision. For example, in one embodiment of the present invention, the CD SEM system 306 can be positioned within a few nanometers of a target location.

It will be apparent to one skilled in the art that the present invention is not dependent on the type of imaging process that is used for taking pictures of the photomask. Accordingly, in the instant application, the CD SEM system 306 should be taken to represent any type of device that can take high resolution pictures.

In one embodiment of the present invention, the computer 304 can directly communicate with the CD SEM system 306 via the network 302. Specifically, in one embodiment of the present invention, the computer 304 and the CD SEM system 306 communicate with each other using files that are stored on the file server 308. Note that both the computer 304 and the CD SEM system 306 can communicate with the file server 308 via the network.

Process for Computing Translational Differentials

Figure 4A:
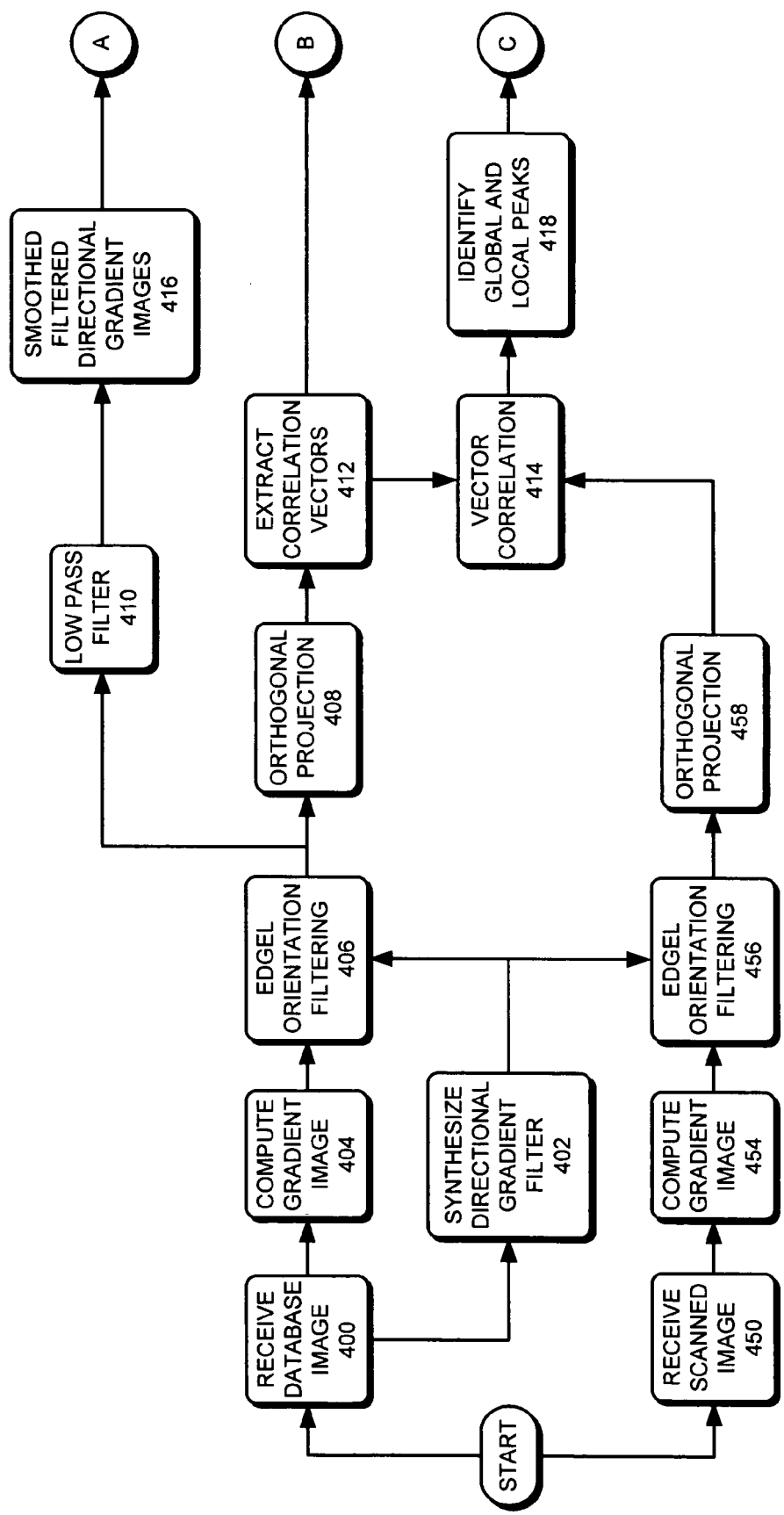
FIG. 4A and FIG. 4B present flowcharts that illustrate the process for computing the translational differentials in accordance with an embodiment of the present invention.
Figure 4B:
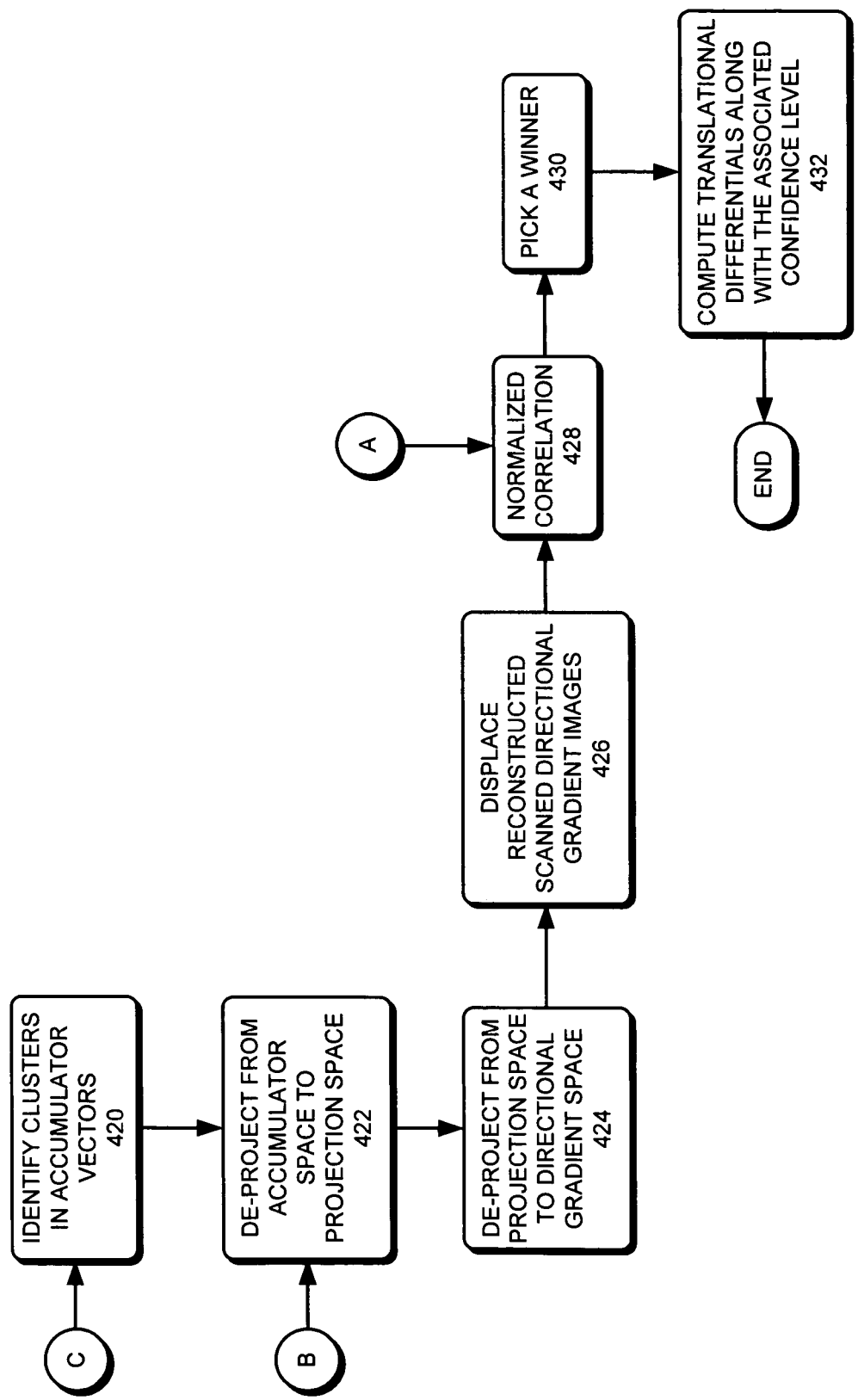

FIG. 4A and FIG. 4B present flowcharts that illustrate the process for computing the translational differentials in accordance with an embodiment of the present invention.

The process begins by receiving a database image (step 400) and a scanned image (step 450). Specifically, in one embodiment of the present invention, the database image is a noise-free 512×512 binary image, and the scanned image is a 512×512 grayscale image with an 8-bit pixel depth. Note that the modality of the two images is different. Furthermore, in one embodiment of the present invention, the photomask contains only rectilinear features. In another embodiment of the present invention, the photomask contains a combination of rectilinear and non-rectilinear features. In yet another embodiment of the present invention, the photomask contains only non-rectilinear features.

Next, the system synthesizes a directional-gradient filter (step 402). Specifically, in one embodiment of the present invention, the directional-gradient filter is synthesized using the database image. In another embodiment of the present invention, the directional-gradient filter is synthesized based on user input. Note that the directional-gradient filter can be used to attenuate edgels that do not conform to the directional gradients of feature edges in the database image.

The system then computes a raw database gradient-image and a raw scanned gradient-image using the database image and the scanned image, respectively (steps 404 and 454).

Specifically, the system first converts the database image and the scanned image into a set of database directional-gradient-images and a set of scanned directional-gradient-images, respectively. The system then computes the raw database gradient-image and the raw scanned gradient-image using the set of database directional gradient-images and the set of scanned directional gradient-images, respectively.

Next, the system filters edgel orientations in the raw database gradient-image and raw scanned gradient-image by applying the gradient-directional filter (steps 406 and 456). This step results in a database gradient-image and a scanned gradient-image.

The system then computes database projection-vectors from the database gradient-image and scanned projection-vectors from the scanned gradient-image by taking orthogonal projections along a set of directions (steps 408 and 458). Specifically, in one embodiment of the present invention, the system projects the pixels of the database gradient-image and the scanned gradient-image along virtual rays orthogonal to their direction and integrates them into elements of a multivariate projection vector. Note that if the features in the integrated circuit are rectilinear, the orthogonal projections can be taken in the horizontal and vertical directions. Moreover, in this case, the horizontal projection vector will have a dimension equal to the image width and the vertical projection vector will have a dimension equal to the image height.

Next, the system extracts correlation vectors from the database projection-vectors (step 412). In one embodiment of the present invention, the projection vectors are one-dimensional. Consequently, the correlation vectors can assume one of two possible directions: either towards the first element of the projection vector or away from it. Specifically, in one embodiment of the present invention, the vector correlations are directed towards the first element of the corresponding projection vectors.

The system then maps the scanned projection-vectors to obtain the accumulator vectors using vector correlation (step 414). Note that, vector correlation uses the correlation vectors to perform the mapping from the projection space to the accumulator space. Furthermore, in one embodiment of the present invention, the system can employ a generalized Hough transform to map the scanned projection-vectors to obtain accumulator-vectors in an accumulator space by using the correlation vectors.

Next, the system detects global and local peaks in the accumulation space (step 418). In one embodiment of the present invention, a primary and a secondary accumulator vector is created for each accumulator direction. Furthermore, in one embodiment of the present invention, the primary and secondary accumulator vectors undergo different amounts of smoothing. Specifically, in one embodiment of the present invention, the secondary accumulator vector undergoes a higher degree of smoothing than the primary accumulator vector. Next, the system identifies a global and two local peaks in the primary accumulator vector. Additionally, the system identifies only a global peak in the secondary accumulator vector.

Note that the location of each global or local peak represents a candidate translational differential. Hence, by identifying global and local peaks in the accumulator vectors, the system obtains a set of candidate translational differentials in each accumulator direction. In one embodiment of the present invention, the system obtains 4 candidate translational differentials in the horizontal and the vertical directions. In this way, the system obtains a total of 16 candidate translational differentials that are derived by taking the cross-product between the set of horizontal translational-differentials and the set of vertical translational-differentials.

The system then identifies peak-cluster locations in the accumulator space (step 420). Note that a peak cluster is a collection of contiguous elements around a peak (including the peak). In one embodiment of the present invention, the peak-clusters are identified based on the global and local peaks.

Next, the system de-projects the accumulator-vectors to the projection space to obtain reconstructed scanned-projection-vectors (step 422). Note that the system uses the correlation vectors to perform the de-projection.

The system then de-projects the scanned-projection-vectors to the directional-gradient-image space to obtain reconstructed directional gradient-images (step 424).

In one embodiment of the present invention, the system suppresses all elements in the reconstructed scanned-projection-vectors except those that contribute to the peak-clusters in the accumulator space. Next, the system de-projects these reconstructed scanned-projection-vectors to the directional-gradient-image space. By doing this, the reconstructed directional-gradient-images can have a higher signal-to-noise ratio than the original directional-gradient-images that were obtained directly from the scanned image.

Next, the system generates one or more sets of translated directional-gradient-images using the set of candidate-translational-differentials (step 426). In one embodiment of the present invention, the system generates 16 sets of translated directional-gradient-images, wherein each set includes a translated horizontal-gradient-image and a translated vertical-gradient-image. Note that each of the 16 sets of translated directional-gradient-images corresponds to the set of 16 candidate translational-differentials that were obtained by taking the cross-product of the set of candidate horizontal translational-differentials and the set of candidate vertical translational-differentials.

Furthermore, the system generates a set of directional-gradient-images based on the database gradient-image that is generated in step 406. Moreover, note that the database gradient-image that is generated in step 406 has already been passed through the directional-gradient filter. Next, the system applies a low-pass filter to the set of directional-gradient-images to obtain a set of smoothed directional-gradient-images (steps 410 and 416).

The system then performs a normalized correlation between the set of smoothed directional-gradient-images and the one or more sets of translated directional-gradient-images (step 428). Note that the value of the normalized correlation can be viewed as a "figure of merit" that indicates the confidence of the match between the two sets of images.

Next, the system picks a winner out of the one or more sets of translated directional-gradient-images (step 430). In one embodiment of the present invention, the set of translated directional-gradient-images that results in the maximum aggregate correlation is chosen as the winner. It will be apparent to one skilled in the art that a variety of decision functions can be used to pick a winner out of the one or more sets of translated directional-gradient-images.

Finally, the system computes the translational differentials along with the associated confidence level based on the winning set of translated directional-gradient-images (step 432).

It will be apparent to one skilled in the art that the system is tolerant to moderate sizing problems between the database image and the scanned image. Note that sizing problems can arise from dimension discrepancies between the synthesized IC features depicted in the database image and their actual dimension as imaged by an imaging device, such as a SEM.

Furthermore, it will be apparent to one skilled in the art that the system is tolerant to ambiguous contrast polarity. Specifically, the system does not rely on contrast direction between the scanned image regions and regional correspondence between the image pair based on contrast polarity.

Additionally, the system registers a database image against its scanned image when the latter is too noisy to enable correlation at coarser resolutions.

Process of Synthesizing a Directional Gradient Filter

Figure 5:
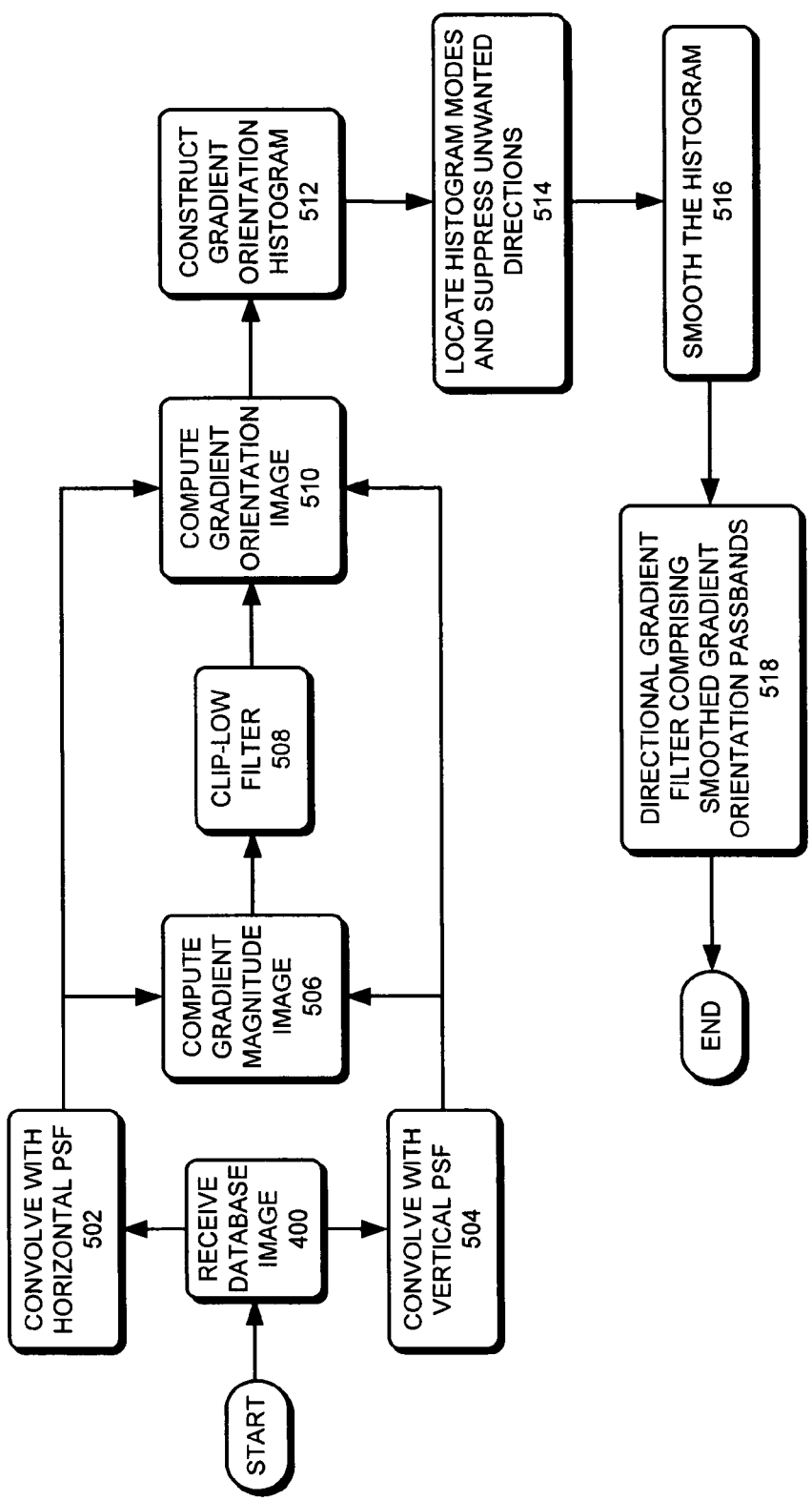
FIG. 5 presents a flowchart that illustrates the process of synthesizing a directional gradient filter.

FIG. 5 presents a flowchart that illustrates the process of synthesizing a directional gradient filter.

The process starts by receiving a database image (step 402).

Next, the system convolves the database image with a horizontal and a vertical point spread function (PSF) to obtain a horizontal gradient-image and a vertical gradient-image, respectively (steps 502 and 504).

The system then computes a gradient magnitude image using the horizontal gradient-image and the vertical gradient-image (step 506).

Next, the system applies a clip-low filter to the gradient magnitude image (step 508). Note that the clip-low filter suppresses the pixels in the gradient magnitude image that contain a value below an adaptive threshold, which is derived by computing a fraction of the mean gradient magnitude image. It will be apparent to one skilled in the art that a variety of functions can be used to derive the adaptive threshold based on the gradient magnitude image.

The system then computes a gradient orientation image using the remaining pixels, i.e., using the pixels whose gradient magnitude is above the adaptive threshold (step 510).

Next, the system constructs a gradient orientation histogram using the gradient orientation image (step 512).

The system then identifies the modes in the histogram (which correspond to the desired directions) and suppresses the other bins (which correspond to the unwanted directions) (step 514).

Next, the system smoothes the histogram (step 516).

Finally, the system constructs the directional gradient-filter using the smoothed histogram (step 518).

Process of Applying a Directional Gradient Filter

Figure 6:
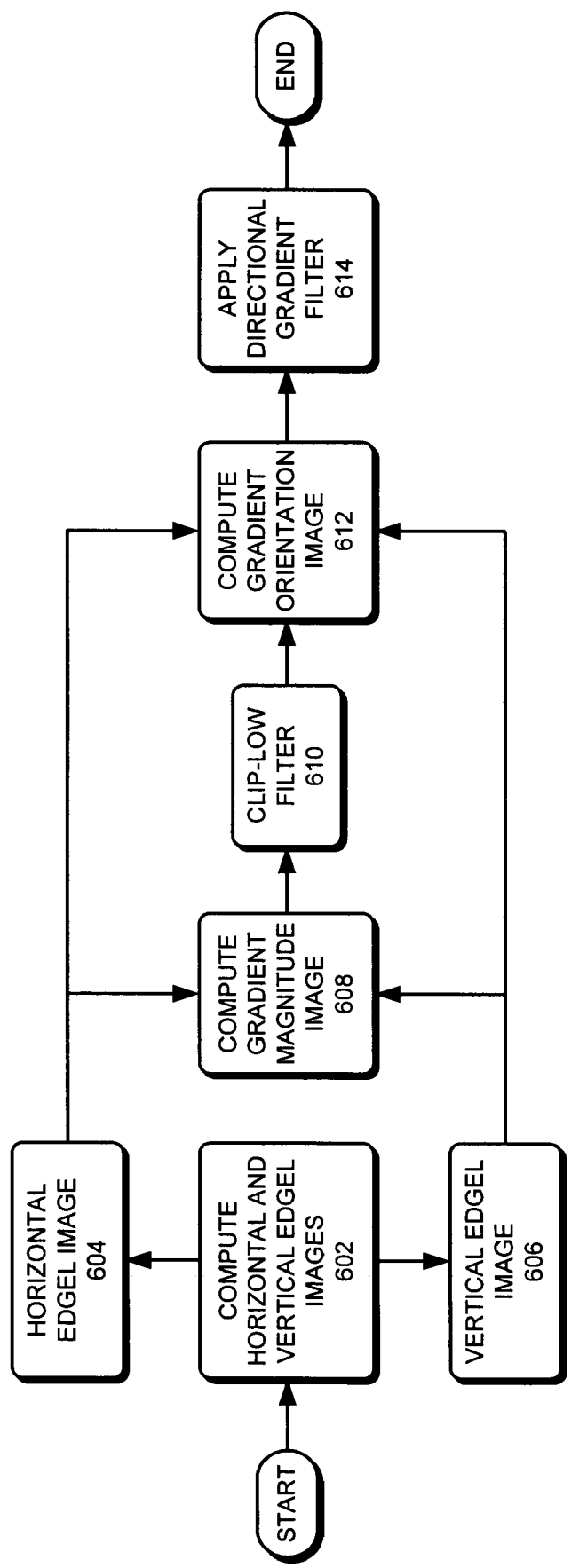
FIG. 6 presents a flowchart that illustrates the process of applying a directional gradient filter to an image.

FIG. 6 presents a flowchart that illustrates the process of applying a directional gradient filter to an image.

The system starts by computing a horizontal gradient-image and a vertical gradient-image of an image (steps 602-606).

Note that the horizontal gradient-image and the vertical gradient-image can be generated by convolving the image with a horizontal PSF and a vertical PSF, respectively. It will be apparent to one skilled in the art that a variety of PSFs can be used for generating the directional gradient-images. Specifically, in one embodiment of the present invention, the database directional-gradient-images are generated by convolving the database image with a Sobel kernel. Furthermore, the scanned directional-gradient-images are generated by convolving the scanned image with the first derivative of a Gaussian. Note that in both cases, the convolution is performed in the vertical and the horizontal directions.

Next, the system computes the gradient-magnitude image from the horizontal gradient-image and the vertical gradient-image (step 608).

The system then applies a clip-low filter to the gradient magnitude image (step 610). Note that the clip-low filter suppresses the pixels in the gradient magnitude image that contain a value below an adaptive threshold, which is derived by computing a fraction of the mean gradient magnitude image. It will be apparent to one skilled in the art that a variety of functions can be used to derive the adaptive threshold based on the gradient magnitude image.

Next, the system computes a gradient orientation image using the remaining pixels, i.e., using the pixels whose value of the gradient magnitude is above the adaptive threshold (step 612).

Finally, the system applies the directional gradient filter to the gradient orientation image to obtain the filtered image (step 614).

Conclusion

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

Furthermore, the data structures and code described in this detailed description are typically stored on a computer-readable storage medium, which may be any type of device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

What is claimed is:

1. A method for computing translational differentials between a database-image and a scanned-image of a photomask, the method comprising:

receiving a noise-free database-image and a scanned-image that is generated by an imaging process;

computing a set of candidate-translational-differentials using the database-image and the scanned-image;

generating one or more sets of translated directional-gradient-images based on the set of candidate-translational-differentials and using the database-image and the scanned-image;

converting the database-image into a set of smoothed directional-gradient-images; and computing translational differentials by performing a normalized correlation using the set of smoothed directional-gradient-images and the one or more sets of translated directional-gradient-images;

wherein the computational time is significantly reduced because the method performs normalized correlation using the set of candidate-translational-differentials, instead of exhaustively performing normalized correlation using all possible translational differentials.

2. The method of claim 1, wherein computing the set of candidate-translational-differentials using the database-image and the scanned-image involves:
   converting the database-image and the scanned-image into a database-gradient-image and a scanned-gradient-image, respectively;
   computing database-projection-vectors from the database-gradient-image and scanned-projection-vectors from the scanned-gradient-image by taking orthogonal projections along a set of directions;
   extracting correlation-vectors from the database-projection-vectors;
   mapping the scanned-projection-vectors to obtain accumulator-vectors in an accumulator space by using the correlation-vectors; and
   computing a set of candidate-translational-differentials based on the peak-cluster locations in the accumulator space, wherein a peak-cluster is a collection of contiguous elements around a peak.

3. The method of claim 2, wherein converting the database-image and the scanned-image into the database-gradient-image and the scanned-gradient-image involves:
   creating a directional-gradient filter using the database-image, wherein the directional-gradient filter can be used to attenuate edgels that do not conform to the directional gradients of feature edges in the database-image;
   converting the database-image and the scanned-image into a set of database directional-gradient-images and a set of scanned directional-gradient-images, respectively;
   generating a raw database-gradient-image and a raw scanned-gradient-image from the set of database directional-gradient-images and the set of scanned directional-gradient-images, respectively; and
   applying the directional-gradient filter to the raw database-gradient-image and the raw scanned-gradient-image to obtain the database-gradient-image and the scanned-gradient-image, respectively.

4. The method of claim 3, wherein creating the directional-gradient filter involves:
   convolving the database-image with a horizontal and a vertical Point Spread Function (PSF) to generate a horizontal edgel-image and a vertical edgel-image, respectively;
   computing a gradient-magnitude-image using the horizontal edgel-image and the vertical edgel-image;
   applying a clip-low filter to the gradient-magnitude-image to obtain a clipped-gradient-image;
   generating a histogram using the gradient orientations in the clipped-gradient-image; and
   creating the directional-gradient filter using the histogram.

5. The method of claim 3, wherein converting the database-image into the set of smoothed directional-gradient-images involves:
   converting the database-gradient-image into a set of unsmoothed directional-gradient-images; and
   applying a low-pass filter to the set of unsmoothed directional-gradient-images to obtain the set of smoothed directional-gradient-images.

6. The method of claim 2, wherein generating the one or more sets of translated directional-gradient-images using the set of candidate-translational-differentials involves:
   de-projecting only the cluster-peaks in the accumulator-vectors to obtain reconstructed scanned-projection-vectors;
   de-projecting the reconstructed scanned-projection-vectors to obtain reconstructed directional-gradient-images; and
   generating one or more sets of translated directional-gradient-images by displacing the reconstructed directional-gradient-images using the set of candidate-translational-differentials;
   wherein de-projecting only the cluster-peaks improves the signal-to-noise ratio of the reconstructed directional-gradient-images.

7. The method of claim 2, wherein computing the database-projection-vectors from the database-gradient-image and the scanned-projection-vectors from the scanned-gradient-image involves taking an orthogonal projection along the horizontal direction and the vertical direction.

8. The method of claim 2, wherein if the database-image and the scanned-image have slightly different dimensions, computing the set of candidate-translational-differentials involves using a smoothing filter to integrate double peaks in the accumulator space into a single peak.

9. The method of claim 1, wherein computing the translational differentials involves selecting the set of translated directional-gradient-images that has the maximum aggregate-normalized-correlation with the set of smoothed directional-gradient-images.

10. The method of claim 1, wherein computing the translational differentials involves reporting a normalized correlation coefficient as a confidence measure accompanying the computed translation differentials and an aggregate correlation score accompanying the overall result as a confidence measure in the total result.

11. The method of claim 1, wherein the contrast polarity between corresponding regions of the database and scanned images may not be relied upon.

12. The method of claim 1, wherein the photomask contains only rectilinear features.

13. A computer-readable storage memory device instructions that when executed by a computer cause the computer to perform a method for computing translational differentials between a database-image and a scanned-image of a photomask, the method comprising:
   receiving a noise-free database-image and a scanned-image that is generated by an imaging process;
   computing a set of candidate-translational-differentials using the database-image and the scanned-image;
   generating one or more sets of translated directional-gradient-images based on the set of candidate-translational-differentials and using the database-image and the scanned-image;
   converting the database-image into a set of smoothed directional-gradient-images; and
   computing translational differentials by performing a normalized correlation using the set of smoothed directional-gradient-images and the one or more sets of translated directional-gradient-images;
   wherein the computational time is significantly reduced because the method performs normalized correlation using the set of candidate-translational-differentials, instead of exhaustively performing normalized correlation using all possible translational differentials.

14. The computer-readable memory device of claim 13, wherein computing the set of candidate-translational-differentials using the database-image and the scanned-image involves:
   converting the database-image and the scanned-image into a database-gradient-image and a scanned-gradient-image, respectively;

computing database-projection-vectors from the database-gradient-image and scanned-projection-vectors from the scanned-gradient-image by taking orthogonal projections along a set of directions;

extracting correlation-vectors from the database-projection-vectors;

mapping the scanned-projection-vectors to obtain accumulator-vectors in an accumulator space by using the correlation-vectors; and computing a set of candidate-translational-differentials based on the peak-cluster locations in the accumulator space, wherein a peak-cluster is a collection of contiguous elements around a peak.

15. The computer-readable memory device of claim 14, wherein converting the database-image and the scanned-image into the database-gradient-image and the scanned-gradient-image involves:

creating a directional-gradient filter using the database-image, wherein the directional-gradient filter can be used to attenuate edgels that do not conform to the directional gradients of feature edges in the database-image;

converting the database-image and the scanned-image into a set of database directional-gradient-images and a set of scanned directional-gradient-images, respectively;

generating a raw database-gradient-image and a raw scanned-gradient-image from the set of database directional-gradient-images and the set of scanned directional-gradient-images, respectively; and applying the directional-gradient filter to the raw database-gradient-image and the raw scanned-gradient-image to obtain the database-gradient-image and the scanned-gradient-image, respectively.

16. The computer-readable memory device of claim 15, wherein creating the directional-gradient filter involves:

convolving the database-image with a horizontal and a vertical Point Spread Function (PSF) to generate a horizontal edgel-image and a vertical edgel-image, respectively;

computing a gradient-magnitude-image using the horizontal edgel-image and the vertical edgel-image;

applying a clip-low filter to the gradient-magnitude-image to obtain a clipped-gradient-image;

generating a histogram using the gradient orientations in the clipped-gradient-image; and creating the directional-gradient filter using the histogram.

17. The computer-readable memory device of claim 15, wherein converting the database-image into the set of smoothed directional-gradient-images involves:

converting the database-gradient-image into a set of unsmoothed directional-gradient-images; and applying a low-pass filter to the set of unsmoothed directional-gradient-images to obtain the set of smoothed directional-gradient-images.

18. The computer-readable memory device of claim 14, wherein generating the one or more sets of translated directional-gradient-images using the set of candidate-translational-differentials involves:

de-projecting only the cluster-peaks in the accumulator-vectors to obtain reconstructed scanned-projection-vectors;

de-projecting the reconstructed scanned-projection-vectors to obtain reconstructed directional-gradient-images; and generating one or more sets of translated directional-gradient-images by displacing the reconstructed directional-gradient-images using the set of candidate-translational-differentials;

wherein de-projecting only the cluster-peaks improves the signal-to-noise ratio of the reconstructed directional-gradient-images.

19. The computer-readable memory device of claim 14, wherein computing the database-projection-vectors from the database-gradient-image and the scanned-projection-vectors from the scanned-gradient-image involves taking an orthogonal projection along the horizontal direction and the vertical direction.

20. The computer-readable memory device of claim 14, wherein if the database-image and the scanned-image have slightly different dimensions, computing the set of candidate-translational-differentials involves using a smoothing filter to integrate double peaks in the accumulator space into a single peak.

21. The computer-readable memory device of claim 13, wherein computing the translational differentials involves selecting the set of translated directional-gradient-images that has the maximum aggregate-normalized-correlation with the set of smoothed directional-gradient-images.

22. The computer-readable memory device of claim 13, wherein computing the translational differentials involves reporting a normalized correlation coefficient as a confidence measure accompanying the computed translation differentials and an aggregate correlation score accompanying the overall result as a confidence measure in the total result.

23. The computer-readable memory device of claim 13, wherein the contrast polarity between corresponding regions of the database and scanned images may not be relied upon.

24. The computer-readable memory device of claim 13, wherein the photomask contains only rectilinear features.

25. An apparatus for computing translational differentials between a database-image and a scanned-image of a photomask, the apparatus comprising:

an image-receiving mechanism configured to receive a noise-free database-image and a scanned-image that is generated by an imaging process;

a candidate-computing mechanism configured to compute a set of candidate-translational-differentials using the database-image and the scanned-image;

a gradient-image-generating mechanism configured to generate one or more sets of translated directional-gradient-images based on the set of candidate-translational-differentials and using the database-image and the scanned-image;

a image-converting mechanism configured to convert the database-image into a set of smoothed directional-gradient-images; and a differential-computing mechanism configured to compute translational differentials by performing a normalized correlation using the set of smoothed directional-gradient-images and the one or more sets of translated directional-gradient-images;

wherein the computational time is significantly reduced because the method performs normalized correlation using the set of candidate-translational-differentials, instead of exhaustively performing normalized correlation using all possible translational differentials.

26. The apparatus of claim 25, wherein the candidate-computing mechanism includes:

a second image-converting mechanism configured to convert the database-image and the scanned-image into a database-gradient-image and a scanned-gradient-image, respectively;

a vector-computing mechanism configured to compute database-projection-vectors from the database-gradient-image and scanned-projection-vectors from the scanned-gradient-image by taking orthogonal projections along a set of directions;

a vector-extracting mechanism configured to extract correlation-vectors from the database-projection-vectors;

a vector-mapping mechanism configured to map the scanned-projection-vectors to obtain accumulator-vectors in an accumulator space by using the correlation-vectors; and a second candidate-computing mechanism configured to compute a set of candidate-translational-differentials based on the peak-cluster locations in the accumulator space, wherein a peak-cluster is a collection of contiguous elements around a peak (including the peak).

27. The apparatus of claim 26, wherein the second image-converting mechanism includes:

a filter-creating mechanism configured to create a directional-gradient filter using the database-image, wherein the directional-gradient filter can be used to attenuate edgels that do not conform to the directional gradients of feature edges in the database-image;

a third image-converting mechanism configured to convert the database-image and the scanned-image into a set of database directional-gradient-images and a set of scanned directional-gradient-images, respectively;

an image-generating mechanism configured to generate a raw database-gradient-image and a raw scanned-gradient-image from the set of database directional-gradient-images and the set of scanned directional-gradient-images, respectively; and a filter-applying mechanism configured to apply the directional-gradient filter to the raw database-gradient-image and the raw scanned-gradient-image to obtain the database-gradient-image and the scanned-gradient-image, respectively.

28. The apparatus of claim 27, wherein the filter-creating mechanism includes:

an image-convolving mechanism configured to convolve the database-image with a horizontal and a vertical Point Spread Function (PSF) to generate a horizontal edgel-image and a vertical edgel-image, respectively;

an image-computing mechanism configured to compute a gradient-magnitude-image using the horizontal edgel-image and the vertical edgel-image;

a second filter-applying mechanism configured to apply a clip-low filter to the gradient-magnitude-image to obtain a clipped-gradient-image;

a histogram-generating mechanism configured to generate a histogram using the gradient orientations in the clipped-gradient-image; and a second filter-creating mechanism configured to create the directional-gradient filter using the histogram.

29. The apparatus of claim 27, wherein the image-converting mechanism includes:

a fourth image-converting mechanism configured to convert the database-gradient-image into a set of unsmoothed directional-gradient-images; and a third filter-applying mechanism configured to apply a low-pass filter to the set of unsmoothed directional-gradient-images to obtain the set of smoothed directional-gradient-images.

30. The apparatus of claim 26, wherein the gradient-image-generating mechanism includes:

a de-projecting mechanism configured to de-project only the cluster-peaks in the accumulator-vectors to obtain reconstructed scanned-projection-vectors;

a second de-projecting mechanism configured to de-project the reconstructed scanned-projection-vectors to obtain reconstructed directional-gradient-images; and an image-generating mechanism configured to generate one or more sets of translated directional-gradient-images by displacing the reconstructed directional-gradient-images using the set of candidate-translational-differentials;

wherein de-projecting only the cluster-peaks improves the signal-to-noise ratio of the reconstructed directional-gradient-images.

31. The apparatus of claim 26, wherein the vector-computing mechanism is further configured to take an orthogonal projection along the horizontal direction and the vertical direction.

32. The apparatus of claim 26, wherein if the database-image and the scanned-image have slightly different dimensions, the second candidate-computing mechanism is further configured to use a smoothing filter to integrate double peaks in the accumulator space into a single peak.

33. The apparatus of claim 25, wherein the differential-computing mechanism is further configured to select the set of translated directional-gradient-images that has the maximum aggregate-normalized-correlation with the set of smoothed directional-gradient-images.

34. The apparatus of claim 25, wherein the differential-computing mechanism is further configured to report a normalized correlation coefficient as a confidence measure accompanying the computed translation differentials and an aggregate correlation score accompanying the overall result as a confidence measure in the total result.

35. The apparatus of claim 25, wherein the contrast polarity between corresponding regions of the database and scanned images may not be relied upon.

36. The apparatus of claim 25, wherein the photomask contains only rectilinear features.

* * * * *

UNITED STATES PATENT AND TRADEMARK OFFICE
CERTIFICATE OF CORRECTION

PATENT NO.       : 7,415,150 B2                                          Page 1 of 1
APPLICATION NO.  : 10/974055
DATED            : August 19, 2008
INVENTOR(S)      : Fereydoun Maali It is certified that error appears in the above-identified patent and that said Letters Patent is hereby corrected as shown below:

In claim 13 (at column 12, line 37), please delete the word, "storage" before the words "memory device" and put the word --storing-- in after "memory device".

Signed and Sealed this

Eleventh Day of November, 2008

JON W. DUDAS
*Director of the United States Patent and Trademark Office*